United States Patent [19]

Koike et al.

[11] 4,409,520

[45] Oct. 11, 1983

[54] MICROWAVE DISCHARGE ION SOURCE

[75] Inventors: Hidemi Koike, Tokorozawa; Noriyuki Sakudo, Ohme; Katsumi Tokiguchi, Hachioji; Ichiro Kanomata, Fuchu, all of Japan

[73] Assignee: Hitachi, Ltd., Tokyo, Japan

[21] Appl. No.: 247,072

[22] Filed: Mar. 24, 1981

[30] Foreign Application Priority Data

Mar. 24, 1980 [JP] Japan .................. 55-36074

[51] Int. Cl.³ .................. H01J 7/46; H01J 19/80
[52] U.S. Cl. .................. 315/39; 250/423 R; 313/363.1; 313/364; 315/111.41; 315/111.81
[58] Field of Search .................. 315/39, 111.4, 111.8, 315/111.41, 111.81; 313/363, 364, 360.1, 361.1, 362.1, 363.1, 364.1; 250/396 ML, 423

[56] References Cited

U.S. PATENT DOCUMENTS

| | | | |
|---|---|---|---|
| 2,698,421 | 12/1954 | Kline et al. .................. | 333/208 |
| 2,886,742 | 5/1959 | Hull .................. | 315/39 |
| 3,518,691 | 6/1970 | Hallendroff .................. | 333/34 X |
| 3,778,656 | 12/1973 | Fremiot et al. .................. | 313/363.1 |
| 4,214,187 | 7/1980 | Mourier .................. | 315/111.8 |
| 4,316,090 | 2/1982 | Sakudo et al. .................. | 313/363.1 |

FOREIGN PATENT DOCUMENTS 28303  5/1981  Fed. Rep. of Germany ... 315/111.8

*Primary Examiner*—Saxfield Chatmon, Jr.
*Attorney, Agent, or Firm*—Antonelli, Terry & Wands

[57] ABSTRACT

A microwave discharge ion source according to this invention comprises a microwave generator, a discharge chamber having ridged electrodes, and a waveguide connecting the microwave generator with the discharge chamber. This waveguide consists of a waveguide having no ridged electrode, and a waveguide having ridged electrodes. Further, a vacuum-sealing dielectric plate is disposed at an intermediate position or an end part of the waveguide having no ridged electrode. A space in the waveguide as extends from the vacuum-sealing dielectric plate to the discharge chamber is filled with a dielectric.

As a result, the design and fabrication of the vacuum-sealing dielectric plate are facilitated, and a microwave discharge ion source of high performance is provided.

8 Claims, 20 Drawing Figures

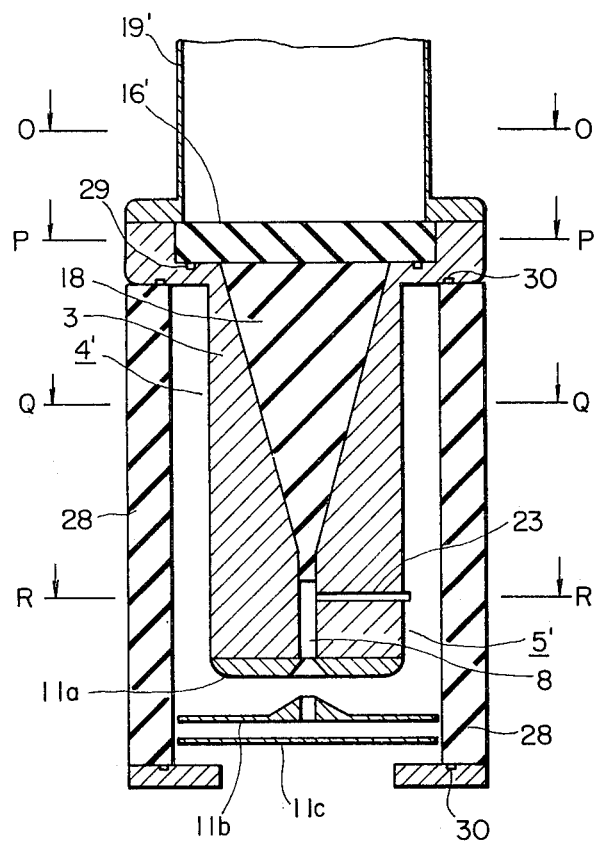

MICROWAVE DISCHARGE ION SOURCE

BACKGROUND OF THE INVENTION

1. Field of the Invention

This invention relates to an ion source, and more particularly to improvements in a microwave discharge ion source which is suited to, for example, an ion implanter for implanting ions into a semiconductor wafer.

2. Description of the Prior Art

A microwave discharge ion source has the great features that the lifetime is long and that ion beams of high currents can be produced. It is therefore used as an ion source for an ion implanter. The microwave discharge ion source is described in detail in the specification of U.S. Pat. No. 4,058,748 issued Nov. 15, 1977.

FIG. 1 shows the fundamental construction of the prior-art microwave discharge ion source. Referring to the figure, microwaves generated by a microwave generator 1 are propagated through a rectangular waveguide 2 and are introduced into a discharge chamber 5 via a rectangular waveguide 4 having ridged electrodes 3 and 3. The discharge chamber 5 is vacuum-sealed from the side of the rectangular waveguide 4 by a vacuum-sealing dielectric plate 6. The discharge chamber 5 is constructed of ridged electrodes 7 and 7, a discharge space 8 formed between the ridged electrodes 7 and 7, a conduit (not shown) for introducing a gas to be ionized, and a dielectric (not shown) packed in a space other than the discharge space 8. The microwaves introduced into the discharge chamber 5 generate an intense microwave electric field between the ridged electrodes 7 and 7. Further, an intense magnetic field is applied to the discharge chamber 5 in a direction (in FIG. 1, the axial direction) intersecting orthogonally to the microwave electric field generated between the ridged electrodes 7 and 7. In order to generate this magnetic field, a solenoid 9 is disposed at the outer periphery of the discharge chamber 5. The sample gas to be ionized is introduced into the discharge space 8 by the gas conduit (not shown), and a plasma of high density is produced in the discharge space 8 by the interaction between the microwave electric field and the magnetic field established within the discharge space 8. An ion beam 10 is extracted by ion extraction electrodes 11 from the high-density plasma thus generated.

The extracted ion beam 10 irradiates a sample 40 such as of a semiconductor. A vacuum chamber 14 is maintained in a vacuum state by a vacuum system 15.

As stated above, in the construction of the prior-art microwave discharge ion source, the vacuum-sealing dielectric plate 6 through which the microwaves propagate and which also works as a vacuum sealing for the discharge chamber 5 is disposed between the discharge chamber 5 and the rectangular waveguide 4 having the ridged electrodes 3 and 3. The vacuum-sealing dielectric plate 6 has the two functions as described above, one of which is to have the microwaves propagate through the rectangular waveguide 4 having the ridged electrodes 3 and 3, to the discharge chamber 5 without reflection and the other of which is to keep the interior of the discharge chamber 5 at a vacuum. To the end of fulfilling the first function, the sectional shape of the vacuum-sealing dielectric plate 6 needs to be similar to either the sectional shape of that part of the rectangular waveguide 4 having the ridged electrodes 3 and 3 which lies in contact with the vacuum-sealing dielectric plate 6, as shown in FIG. 2A (section a—a in FIG. 1), or the sectional shape of the discharge chamber 5 lying in contact with the vacuum-sealing dielectric plate 6, as shown in FIG. 2B (section b—b in FIG. 1). That is, the vacuum-sealing dielectric plate 6, in its sectional shape, needs to be: (1) a rectangular plate which has metal parts corresponding to the ridge portions 3 and 3 of the rectangular waveguide 4 having the ridged electrodes shown in FIG. 2A and in which a part corresponding to the other space 12 is filled with a dielectric, or (2) a circular plate 6' as shown in FIG. 3A which has metal parts 7' and 7' corresponding to the ridged electrodes 7 and 7 of the discharge chamber 5 shown in FIG. 2B and in which a part 13' corresponding to the other space 13 is filled with a dielectric. To the end of fulfilling the second function, a dielectric having an excellent high-frequency characteristic and being non-porous, such as forsterite ceramics and aluminous ceramics, is the most suitable as the dielectric material which fills the part 13' corresponding to the aforecited space 13. These materials, however, are sintered dielectrics and are quite unsuitable to be molded by machining. Further, in case where a plate in a complicated shape having corners as in the sectional shape of the dielectric part 13' illustrated by way of example in FIG. 3A is fabricated with the aforecited dielectric material and by sintering, the finish accuracy of the dielectric part 13' is very inferior. In order to enhance the finish accuracy even slightly, the sintering must be repeatedly performed by remaking dies. In addition, in order to achieve the second function of the vacuum-sealing dielectric plate 6 or the vacuum sealing by the use of the circular plate 6' of such structure made of the composite consisting of the metal parts 7' and 7' and the dielectric part 13', the metallization of and welding to the dielectric part 13' are required, the simultaneous machining of the metal parts 7' and 7' and the dielectric part 13', etc., so that the cost of the circular plate 6' is expensive. With the intention of solving these problems, a vacuum-sealing dielectric plate 6" as shown by way of example in FIG. 3B was fabricated in which a dielectric part 13" had a shape substantially corresponding to the shape shown in FIG. 3A. Circular parts 7" and 7" corresponding to the ridged electrode parts 7' and 7' were formed merely by inserting discs which were separately fabricated of copper by machining. The vacuum sealing was effected by means of two O-ring gaskets somewhat larger in diameter than the circular parts 7" and 7" and one O-ring gasket somewhat smaller in diameter than the vacuum-sealing dielectric plate 6". A good result was obtained as to the vacuum sealing, whereas the reflection of the microwaves from the vacuum-sealing dielectric plate 6" came to occur. This will be ascribable to the change of the shape and the mismatching of the impedance attributed to the fact that the ridged electrode parts 7' and 7' in FIG. 3A were turned into the circular parts 7" and 7" as shown in FIG. 3B. Regarding this problem of the mismatched impedance, since the sectional shape of the vacuum-sealing dielectric plate 6" is complicated as shown in FIG. 3B, the calculation of the impedance is very difficult. In case of such sectional shape, accordingly, it is in effect impossible to achieve the matching of the impedance in the vacuum-sealing dielectric plate 6". Therefore, such problems occurred that the reflection of the microwaves from the vacuum-sealing dielectric plate 6" developed, that the loss of the output of the microwave generator 1 increased due to the reflection, and that when a microwave generator 1 of high power was used in order to cover the output loss, abnormal sparks were incurred in the vicinity of the vacuum-sealing dielectric plate 6″.

SUMMARY OF THE INVENTION

It is accordingly an object of this invention to provide a microwave discharge ion source having a vacuum-sealing dielectric plate which has a very simple sectional shape and which scarcely causes reflection.

In order to accomplish the object, according to this invention, a microwave discharge ion source consists of means for generating microwaves, a discharge chamber which has ridged electrodes for introducing the microwaves generated by the microwave generating means and establishing a microwave electric field therein and the interior of which is maintained in a vacuum state, a waveguide which is disposed between said microwave generating means and said discharge chamber and which consists of a first section having no ridged electrode and serving to guide said microwaves generated by said microwave generating means to said discharge chamber without reflecting them and a second section having ridged electrodes, a vacuum-sealing dielectric plate which is disposed in said first section of said waveguide in order to maintain said discharge chamber in the vacuum state and also to propagate said microwaves without reflecting them, and an insulating packed material which is packed in a space in said waveguide existent between said vacuum-sealing dielectric plate and said discharge chamber in order to prevent any discharge outside said discharge chamber.

According to such characterizing construction of this invention, the vacuum-sealing dielectric plate may be disposed at an end part or an intermediate position of the waveguide having no ridged electrode, and hence, its sectional shape becomes a very simple shape. As a result, the calculation of the impedance of the vacuum-sealing dielectric plate becomes easy, and the vacuum-sealing dielectric plate having geometries which scarcely cause reflection can be fabricated. In addition, since the sectional shape of the vacuum-sealing dielectric plate is the very simple shape, the dielectric plate can be molded into the desired shape very simply and inexpensively even with a dielectric of the ceramics type, such as forsterite ceramics and aluminous ceramics which are difficult to mold in a complicated shape.

BRIEF DESCRIPTION OF THE DRAWING

FIG. 10 is a view of still another concrete construction of the microwave discharge ion source according to this invention.

DESCRIPTION OF THE PREFERRED EMBODIMENTS

Figure 1:
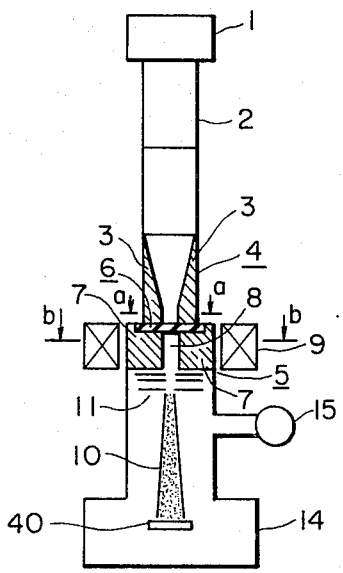
FIG. 1 is a view of the fundamental construction of a prior-art microwave discharge ion source.
Figure 2A:
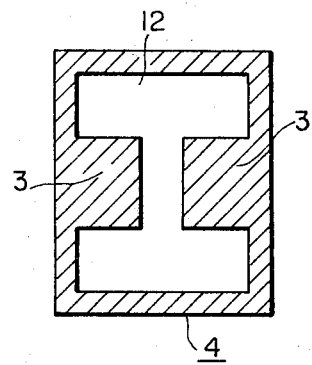
FIGS. 2A and 2B are views of sections a—a and b—b in FIG. 1, respectively.
Figure 2B:
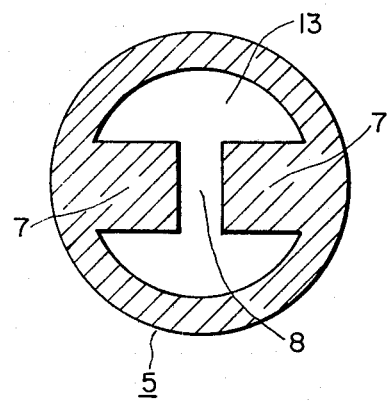
Figure 3A:
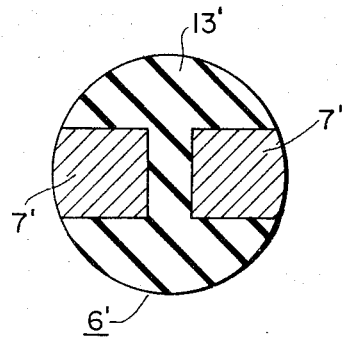
FIGS. 3A and 3B are sectional views of vacuum-sealing dielectric plates in FIG. 1.
Figure 3B:
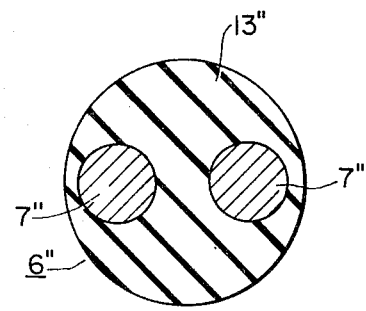
Figure 4:
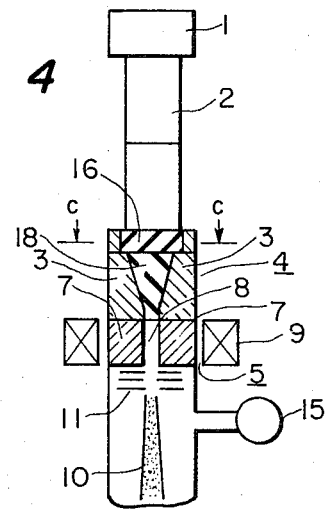
FIG. 4 is a view of the fundamental construction of a microwave discharge ion source according to this invention.
Figure 5:
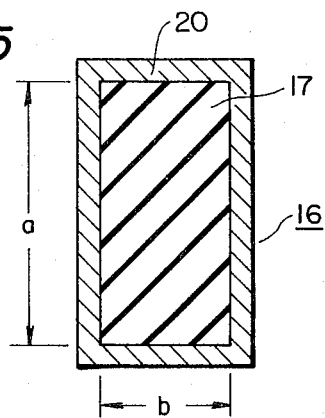
FIG. 5 is a view of a section c—c in FIG. 4.

FIG. 4 shows the fundamental construction of a microwave discharge ion source according to this invention. The point of difference between the construction of the microwave discharge ion source according to this invention shown in FIG. 4 and that of the prior art shown in FIG. 1 resides in the position of installation of the vacuum-sealing dielectric plate 6 (16) as apparent by comparing FIGS. 1 and 4. Mor specifically, in the construction of the prior art illustrated in FIG. 1, the vacuum-sealing dielectric plate 6 is installed between the rectangular waveguide 4 having the ridged electrodes 3 and 3 and the discharge chamber 5. In contrast, in the construction of this invention illustrated in FIG. 4, the vacuum-sealing dielectric plate 16 is installed between the rectangular waveguide 4 having the ridged electrodes 3 and 3 and an end part of the rectangular waveguide 2 having no ridged electrode. The vacuum-sealing dielectric plate 16 may well be disposed at an intermediate position of the rectangular waveguide 2 having no ridged electrode. When, in this manner, the vacuum-sealing dielectric plate 16 is disposed at the end part or at an intermediate position of the rectangular waveguide 2 having no ridged electrode, the sectional shape (section c—c in FIG. 4) dielectric plate 17 is rectangular as shown in FIG. 5. Such rectangular dielectric plate 17 can be simply molded even with the dielectric material, such as forsterite ceramics and aluminous ceramics which are difficult to mold in a complicated shape. In addition, since the vacuum-sealing dielectric plate 16 consists of a flange portion 20 and the rectangular dielectric plate 17, its impedance can be simply calculated, and hence, the dimensions necessary for establishing the matching can be readily calculated. With the construction of this invention shown in FIG. 4, the discharge space 8 is not confined between the ridged electrodes 7 and 7, but it is in substance expanded to the space between the ridged electrodes 3 and 3 of the rectangular waveguide 4 having these ridged electrodes. In order to limit the discharge space 8 to between the ridged electrodes 7 and 7, therefore, the whole space of the discharge space 8 except the part thereof between the ridged electrodes 7 and 7 is filled with a packed material 18 which is made of a dielectric such as sintered boron nitride. The fundamental operation of the microwave discharge ion source according to this invention thus constructed is that, as explained in connection with the prior-art microwave discharge ion source in FIG. 1, microwaves generated by the microwave generator 1 propagate through the rectangular waveguide 2 having no ridged electrode and reach the vacuum-sealing dielectric plate 16 disposed at the end part of the rectangular waveguide 2 having no ridged electrode. The microwaves reaching the matched vacuum-sealing dielectric plate 16 propagate therethrough without being appreciably reflected here, to be led to the rectangular waveguide 4 having the ridged electrodes 3 and 3. Then the microwaves propagate through this rectangular waveguide 4, the whole space of which is filled with the packed material 18 and which has the ridged electrodes 3 and 3 formed with an inclination so as not to cause reflection, whereupon they are led to the discharge chamber 5 which has the ridged electrodes 7 and 7. The discharge chamber 5 is vacuum-sealed from the rectangular waveguide 2 having no ridged electrode by means of the vacuum-sealing dielectric plate 16. The structure of the discharge chamber 5 and the process of producing a plasma in the discharge chamber 5 are quite the same as explained in connection with the prior-art microwave discharge ion source in FIG. 1.

Even when the rectangular waveguide 2 having no ridged electrode and the rectangular waveguide 4 having the ridged electrodes 3 and 3 are respectively replaced with a circular waveguide having no ridged electrode and a circular waveguide having ridged electrodes, the microwave discharge ion source according to this invention can be constructed. In this case, naturally the sectional shape of a dielectric plate which also works as a vacuum-sealing dielectric plate 16 becomes circular.

Since, in this manner, the vacuum-sealing dielectric plate 16 is disposed at the intermediate position or at an end part of the rectangular or circular waveguide 2 having no ridged electrode, its sectional shape is allowed to be a simple shape. Further, owing to the simplicity of shape, the impedance in the case where the ion source is viewed as a microwave circuit can be precisely calculated, and a highly efficient microwave circuit having almost no reflection can be constructed.

By way of example, in case where, in propagating microwaves of 2.45 GHz from the rectangular waveguide 2 having no ridged electrode to the rectangular waveguide 4 having the ridged electrodes 3 and 3, the dimensions of the entrance of the rectangular waveguide 4 having the ridged electrodes 3 and 3 are a=75 mm and b=26 mm and boron nitride ($\epsilon_r$=4) is contained as the packed material 18, the characteristic impedance Z is calculated by the following expression and its value becomes Z=71.6Ω.

$$Z = 120\pi \frac{1}{\sqrt{\epsilon_r}} \cdot \frac{\lambda_g}{\lambda} \cdot \frac{b}{a}$$

where
Z: characteristic impedance (Ω)
$\lambda_g$: guide wavelength (mm)
$\lambda$: free space wavelength (mm)
$\epsilon_r$: relative dielectric constant
a, b: dimensions of the length and width of the rectangular waveguide (mm)

When the dimensions of the vacuum-sealing dielectric plate 16 are a=88 mm and b=40 mm and the material of the dielectric thereof is made of forsterite ceramics ($\epsilon_r$=6.2), the characteristic impedance of this vacuum-sealing dielectric plate 16 becomes Z=71.7Ω, so that the impedances can be matched very precisely. Further, when the thickness of the vacuum-sealing dielectric plate 16 is set to be odd times of $\lambda_g/4$ (in case of the above example, $\lambda_g$=51.2 mm and therefore t=12.8 mm), even a slight amount of reflection of the microwaves ascribable to the difference of the dimensions of the rectangular waveguides before and behind the vacuum-sealing dielectric plate 16 can be suppressed. In the above example, both the length and the width are greater in the vacuum-sealing dielectric plate 16 than in the rectangular waveguide 4 having the ridged electrodes 3 and 3, and hence, the vacuum sealing can be effected with O-ring gaskets or the like by utilizing the surplus portion.

In order to facilitate still better understanding of the microwave discharge ion source according to this invention as described above, several concrete embodiments will be mentioned below.

EMBODIMENT 1

Figure 6:
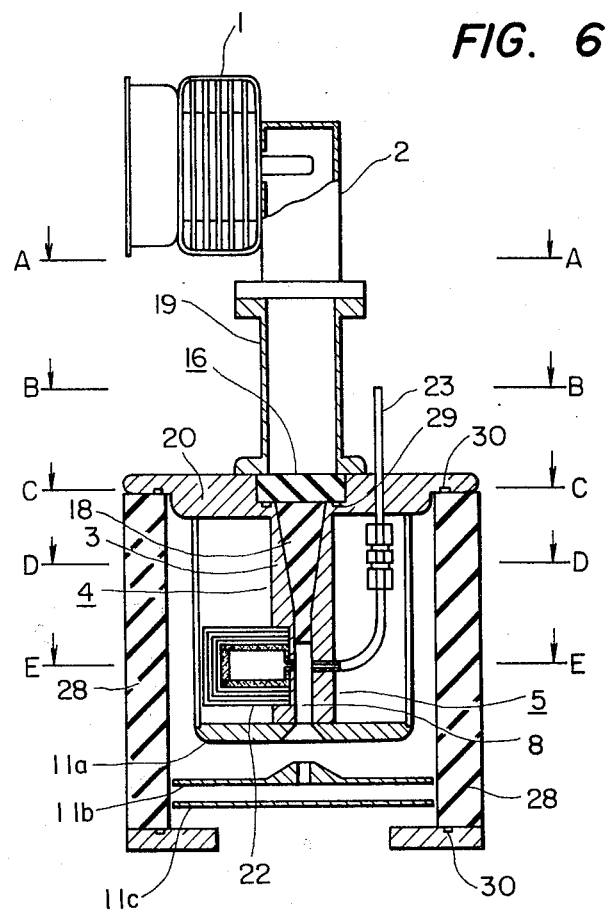
FIG. 6 is a view of a concrete construction of the microwave discharge ion source according to this invention.
Figure 7A:
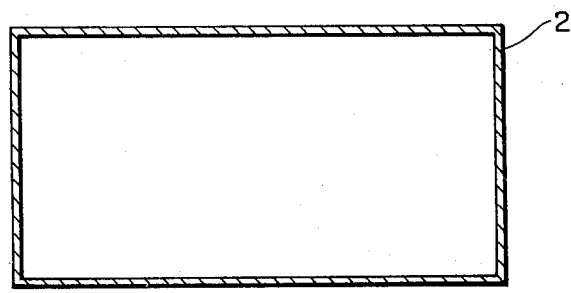
FIGS. 7A to 7E are views of sections A—A to E—E in FIG. 6, respectively.
Figure 7B:
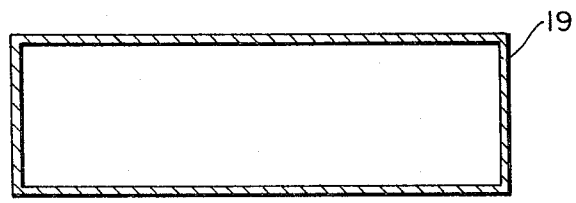
Figure 7C:
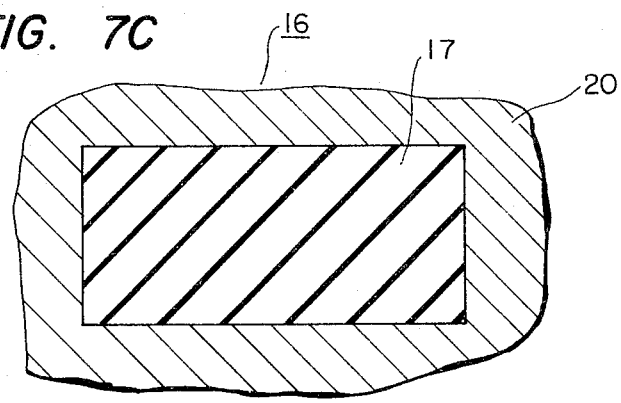
Figure 7D:
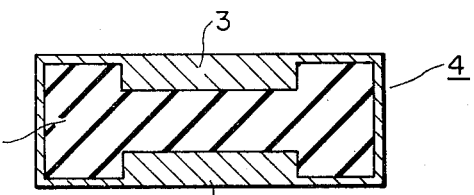
Figure 7E:
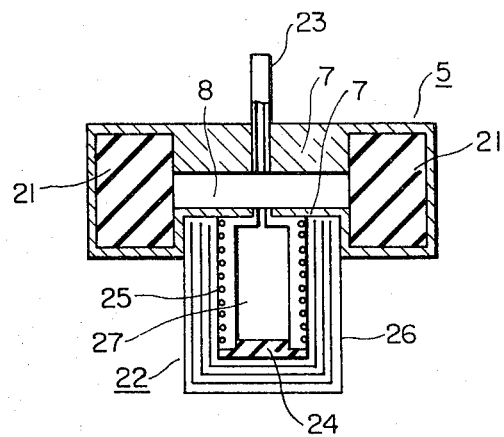

FIG. 6 shows the first embodiment of the microwave discharge ion source according to this invention, the fundamental construction of which is the same as the construction illustrated in FIG. 4. That is, it is an example of concrete construction in which the vacuum-sealing dielectric plate 16 is disposed at the end part of a rectangular waveguide 19 having no ridged electrode. In the figure, numeral 1 designates a magnetron which produces a 2.45 GHz microwave of 840 W. Numeral 2 designates a copper-made rectangular waveguide having no ridged electrode, the horizontal section A—A of which is shown in FIG. 7A. The dimensions of the length and width of the section of the rectangular waveguide 2 having no ridged electrode are 109.2 mm×54.6 mm, and the characteristic impedance $Z_A$ of the rectangular waveguide is approximately 228Ω. Numeral 19 indicates the rectangular waveguide made of stainless steel for impedance matching, and the horizontal section B—B thereof is shown in FIG. 7B. The dimensions of the length and width of the section of the impedance-matching rectangular waveguide 19 having no ridged electrode are 109.2 mm×30.6 mm, and the characteristic impedance $Z_B$ of the rectangular waveguide is approximately 128Ω. The length of the rectangular waveguide 19 is 111 mm and is odd times of $\lambda_g/4$ (in this case, $\lambda_g$=148 mm and the length is three times of $\lambda_g/4$). Numeral 16 indicates the vacuum-sealing dielectric plate, the horizontal section C—C of which is shown in FIG. 7C. The vacuum-sealing dielectric plate 16 is made of a dielectric plate 17 of forsterite ceramics ($2MgO \cdot SiO_2$) whose relative dielectric constant is approximately 6.2. The length and width dimensions of the dielectric plate 17 are 88 mm×40 mm, and the characteristic impedance $Z_C$ thereof is approximately 72Ω. The vacuum-sealing dielectric plate 16 is mounted on a flange portion 20. Numeral 4 denotes a rectangular waveguide having ridged electrodes 3 and 3 and made of stainless steel, and the horizontal section D—D thereof is shown in FIG. 7D. The dimensions of the length and width of the entrance of the rectangular waveguide 4 having the ridged electrodes 3 and 3 are 75 mm×26 mm, and the characteristic impedance $Z_D$ of the entrance in the case of employing sintered boron nitride exhibitive of a relative dielectric constant of approximately 4 as a packed material 18 is approximately 72Ω. That is, the rectangular waveguide 4 having the ridged electrodes 3 and 3 and the vacuum-sealing dielectric plate 16 are perfectly matched. The rectangular waveguide 2 having no ridged electrode and the vacuum-sealing dielectric plate 16 have the relation of $Z_B \doteq \sqrt{Z_A \times Z_C} \doteq 128\Omega$ held by the matching rectangular waveguide 19 having no ridged electrode and are therefore matched perfectly, with the result that the reflection of microwaves does not occur. Shown at numeral 5 is a discharge chamber, the horizontal section E—E of which is depicted in FIG. 7E. The discharge chamber 5 is constructed of ridged electrodes 7 and 7 which are made of stainless steel, a discharge space 8 which is formed between the ridged electrodes 7 and 7, a packed material 21 which is made of sintered boron nitride and which is packed in a space except the discharge space 8, a conduit 23 which serves to introduce a gas to-be-ionized into the discharge space 8, and a solid material vaporizer 22 which serves to supply the discharge space 8 with the vapors of substances to be ionized. In case of using the microwave discharge ion source for an ion implanter, the gaseous samples to be ionized are $PH_3$, $BF_3$ etc., while the solid samples to be ionized are Sb, As, P etc. The solid material vaporizer 22 has its core 27 constructed of a body 24 of sintered boron nitride, and has a tungsten heater 25 wound round the outer periphery of the body 24. Further, a heat shielding plate 26 made of Ta or Mo is disposed in many folds outside the heater 25, to enhance the heat efficiency of the solid material vaporizer 22.

11a, 11b and 11c represent extraction electrodes, and typically, voltages of +40 kV, −2 kV and 0 kV are respectively applied to the electrodes 11a, 11b and 11c. Numeral 28 denotes an insulator which is made of aluminous ceramics or the like. Numerals 29 and 30 denote O-ring gaskets for effecting the vacuum sealing. Although not shown, a solenoid for establishing a magnetic field in the discharge space 8 is disposed outside the insulator 28. Furthermore, the matching rectangular waveguide 19 having no ridged electrode can be omitted by properly selecting the dimensions of the rectangular waveguide 2 having no ridged electrode, the dimensions of the entrance and the kind of the packed material of the rectangular waveguide 4 having the ridged electrodes 3 and 3, and the dimensions and material of the dielectric plate 17 of the vacuum-sealing dielectric plate 16 respectively.

Besides the features stated before, the present embodiment brings forth the advantages that since the distance from the discharge chamber 5 to the vacuum-sealing dielectric plate 16 can be made long, the disposition of the solid material vaporizer 22 becomes possible, and that since the distances from the solid material vaporizer 22 to the O-ring gaskets 29 and 30 stated above can be made long, heat generated from the solid material vaporizer 22 affects the O-ring gaskets 29 and 30 less adversely.

EMBODIMENT 2

Figure 8:
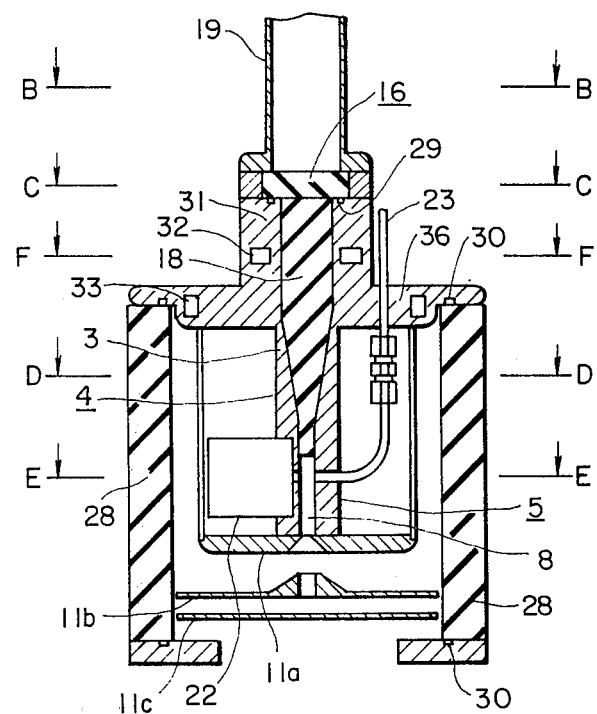
FIG. 8 is a view of another concrete construction of the microwave discharge ion source according to this invention.
Figure 9:
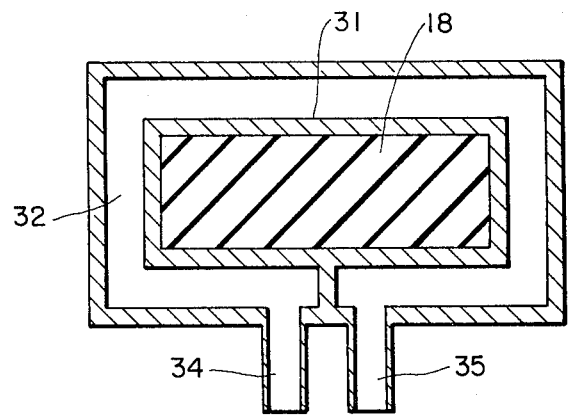
FIG. 9 is a view of a section F—F in FIG. 8.

FIG. 8 shows the second embodiment of the microwave discharge ion source according to this invention, and the fundamental construction thereof consists in that the vacuum-sealing dielectric plate 16 is disposed between a rectangular waveguide 19 having no ridged electrode and a rectangular waveguide 31 similarly having no ridged electrode. In the figure, numeral 19 designates the rectangular waveguide for impedance matching having no ridged electrode, and numeral 16 the vacuum-sealing dielectric plate. Their horizontal sections B—B and C—C are the same as shown in FIGS. 7B and 7C respectively, and the length and width dimensions and the characteristic impedances are the same as in Embodiment 1. Accordingly, the characteristic impedance $Z_C$ of the vacuum-sealing dielectric plate 16 becomes approximately 72Ω. Numeral 31 indicates a copper-made rectangular waveguide having no ridged electrode, the horizontal section F—F of which is shown in FIG. 9. The length and width dimensions of the section of the rectangular waveguide 31 having no ridged electrode are 75 mm × 26 mm, and the characteristic impedance $Z_F$ in the case of employing sintered boron nitride exhibitive of a relative dielectric constant of approximately 4 as a packed material 18 is approximately 72Ω. As stated in Embodiment 1, numeral 4 indicates a rectangular waveguide having ridged electrodes 3 and 3, and the characteristic impedance $Z_D$ at the entrance thereof is approximately 72Ω. That is, the respective characteristic impedances $Z_C$, $Z_F$ and $Z_D$ (at entances) of the vacuum-sealing dielectric plate 16, the rectangular waveguide 31 having no ridged electrode and the rectangular waveguide 4 having the ridged electrodes 3 and 3 can be made equal, so that the reflection of microwaves does not occur. Numerals 32 and 33 indicate cooling holes. As shown in FIG. 9, the cooling hole 32 encircles the rectangular waveguide 31 having no ridged electrode. A cooling medium (water, air, Freon, or the like) is led in through an inlet 34, circulated through the cooling hole 32 and led out of an outlet 35. This serves to prevent an O-ring gasket 29 from being adversely affected by heat produced when a solid material vaporizer 22 is operated. For the same reason, a flange 36 is provided with the cooling hole 33 so as to protect an O-ring gasket 30 from heat.

Besides the features described before, the present embodiment brings forth the advantage that since the distance between the solid material vaporizer 22 and the vacuum-sealing dielectric plate 16 can be made long and moreover these constituents can be thermally cut off by the cooling medium, the O-ring gasket 29 etc. can be reliably protected from heat.

EMBODIMENT 3

Figure 11A:
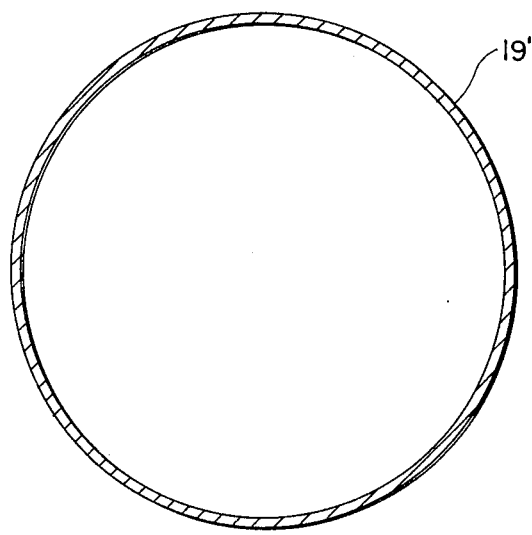
FIGS. 11A to 11D are views of sections O—O to R—R in FIG. 10, respectively.
Figure 11B:
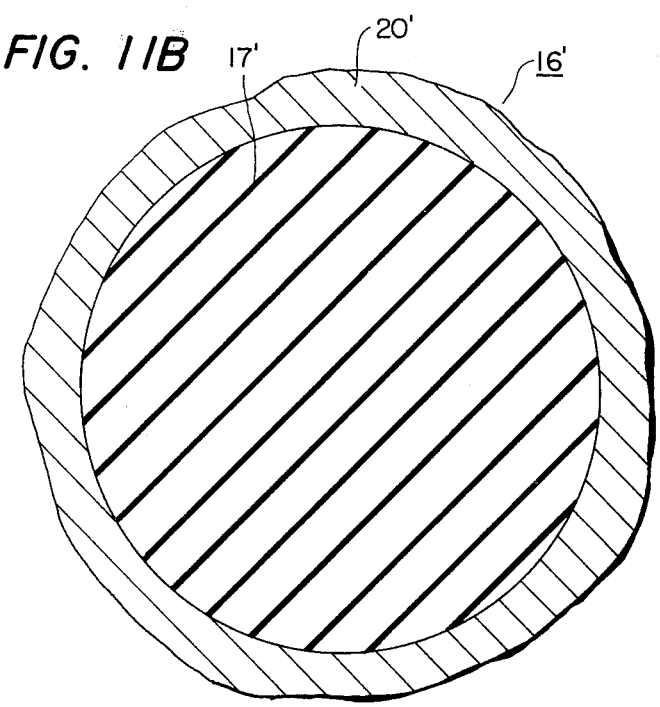
Figure 11C:
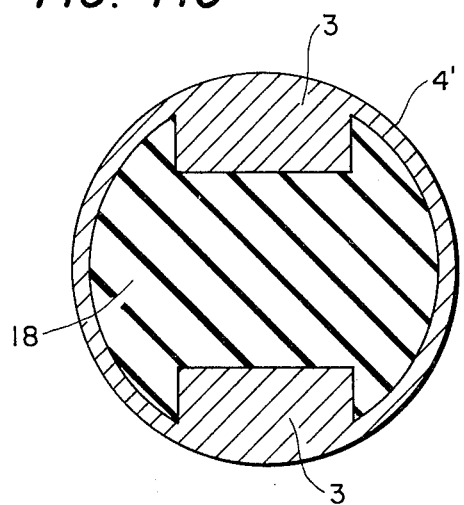

FIG. 10 shows the third embodiment of the microwave discharge ion source according to this invention. It has the same fundamental construction as the construction shown in FIG. 4, and it is a concrete example which is constructed by substituting a circular waveguide for the rectangular waveguide in Embodiment 1. In the figure, symbol 19' represents the circular waveguide having no ridged electrode and made of copper, and the horizontal section O—O thereof is shown in FIG. 11A. Symbol 16' represents a vacuum-sealing dielectric plate, the horizontal section P—P of which is shown in FIG. 11B. The vacuum-sealing dielectric plate 16' is constructed of a dielectric plate 17' which is a disc made of aluminous ceramics, and a flange portion 20'. Shown at 4' is the circular waveguide having ridged electrodes 3 and 3 and made of copper, and the horizontal section Q—Q thereof is shown in FIG. 11C. The space part of the circular waveguide 4' having the ridged electrodes 3 and 3 is filled with sintered boron nitride as a packed material 18. Here, letting $Z_O$ denote the characteristic impedance of the circular waveguide 19', $Z_P$ the characteristic impedance of the vacuum-sealing dielectric plate 16', and $Z_Q$ the characteristic impedance of the entrance of the circular waveguide 4' having the ridged electrodes 3 and 3, the relationship of $Z_O = Z_P = Z_Q$ or the relationship of $Z_P = \sqrt{Z_O \times Z_Q}$ and t = odd times of $\lambda_g/4$ may hold in order to match the impedances. Conversely, when the respective diameters of the circular waveguide 19', the vacuum-sealing dielectric plate 16' and the circular waveguide 4' having the ridged electrodes 3 and 3 are determined so as to satisfy such relationship, the reflection of mmicrowaves does not occur.

Alternatively, it is allowed that a circular waveguide having no ridged electrode, which has a characteristic impedance of $Z_X$ and a length equal to odd times of $\lambda_g/4$ is disposed before the circular waveguide 19' and that the respective diameters of the circular waveguides are determined so as to satisfy the relationship of $Z_O$.

$=\sqrt{Z_X \times Z_P}$ and $Z_P = Z_Q$. In this case, the circular waveguide 19' functions as a waveguide for impedance matching.

Figure 11D:
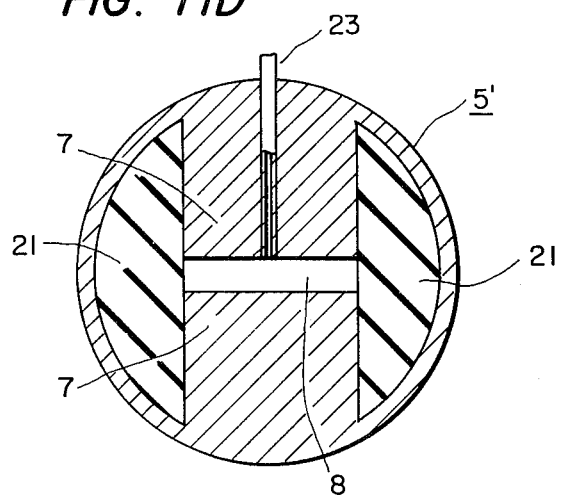

Numeral 5' indicates a discharge chamber, the horizontal section R—R of which is shown in FIG. 11D. Although a solid material vaporizer is not shown in the discharge chamber 5', it can be installed as in the other embodiments. It goes without saying that the vacuum-sealing dielectric plate 16' can be disposed, not only at the end part of the circular waveguide 19' having no ridge electrode, but also at an intermediate position thereof.

As thus far described, according to this invention, the sectional shape of the vacuum-sealing dielectric plate is permitted to be a very simple shape, with the result that even a dielectric of the ceramics type, such as forsterite ceramics and aluminous ceramics which are difficult to mold in a complicated shape can be molded at an expense of about 1/5 of that in the prior art. Further, since the sectional shape of the vacuum-sealing dielectric plate is simplified, the calculation of the characteristic impedance thereof becomes easy, and the matching of impedances can be precisely established. Yet further, since the spacing between a discharge chamber and the vacuum-sealing dielectric plate can be made great, a countermeasure against heat for O-ring gaskets etc. is easy even when a solid material vaporizer is installed, and microwave discharge ion sources for gases and for solids can be realized by an identical device, with the result that the standardization of microwave discharge ion sources becomes possible.

Regarding waveguides, besides rectangular and circular waveguides, elliptic waveguides can be employed to construct the microwave discharge ion source according to this invention. As packed materials for preventing discharge, even when forsterite ceramics or aluminous ceramics other than sintered boron nitride is employed, a similar effect can of course be obtained. However, the boron nitride is the most suitable because, in spite of a sintered compact, it possesses an excellent machinability not existing in the other dielectrics. Further, although in any of the foregoing embodiments the packed material made of the dielectric is not inserted in the waveguide having no ridge electrode as extends from the vacuum-sealing dielectric plate to the microwave generator, this waveguide may well be wholly or partly filled with the packed material for the purposes of the adjustments of impedances, etc.

We claim:

1. A microwave discharge ion source comprising means for generating microwaves, a discharge chamber which has ridged electrodes for introducing the microwaves generated by the microwave generating means and establishing a microwave electric field and which is maintained in a vacuum state, and a waveguide which guides said microwaves generated by said microwave generating means to said discharge chamber; said waveguide consisting of a section which has no ridged electrode and which serves to guide said microwaves generated by said microwave generating means to said discharge chamber without reflecting them, and a section which has ridged electrodes; a vacuum-sealing dielectric plate being disposed in said section of said waveguide having no ridged electrode, said vacuum-sealing dielectric plate serving to maintain the vacuum state of said discharge chamber and also to propagate said microwaves without reflecting them; an insulating packed material being packed in a space in said waveguide existent between said vacuum-sealing dielectric plate and said discharge chamber, said insulating packed material serving to prevent any discharge outside said discharge chamber.

2. A microwave discharge ion source according to claim 1, wherein said waveguide is constructed of a first waveguide having no ridged electrode and a second waveguide having ridged electrodes, and said first waveguide is provided with said vacuum-sealing dielectric plate.

3. A microwave discharge ion source according to claim 2, wherein said vacuum-sealing dielectric plate is disposed at an end part of said first waveguide on the second waveguide side.

4. A microwave discharge ion source according to claim 2, wherein said vacuum-sealing dielectric plate is disposed at an intermediate position of said first waveguide.

5. A microwave discharge ion source according to claim 1, wherein said waveguide is a rectangular waveguide.

6. A microwave discharge ion source according to claim 1, wherein said waveguide is a circular waveguide.

7. A microwave discharge ion source according to claim 1, wherein said vacuum-sealing dielectric plate is made of one member selected from the group consisting of forsterite ceramics and aluminous ceramics.

8. A microwave discharge ion source according to claim 1, wherein said insulating packed material is sintered boron nitride.

* * * * *